United States Patent [19]

Cabaud

[11] Patent Number: 4,616,416
[45] Date of Patent: Oct. 14, 1986

[54] METHOD OF APPLYING CONTACTS TO CIRCUIT SUPPORT

[76] Inventor: Aimé Cabaud, 28, rue de Villacoublay, Velizy, France

[21] Appl. No.: 630,597

[22] Filed: Jul. 13, 1984

Related U.S. Application Data

[62] Division of Ser. No. 405,078, Aug. 4, 1982, abandoned.

[30] Foreign Application Priority Data

Aug. 14, 1981 [FR] France ................................ 81 15964

[51] Int. Cl.4 ............................................. H01R 43/00
[52] U.S. Cl. ........................................ 29/884; 29/874; 339/27 ST; 339/276 SF
[58] Field of Search ................... 29/876, 856, 881–882, 29/884, 874, 588; 339/258 R; 174/52 FP

[56] References Cited

U.S. PATENT DOCUMENTS

| | | | |
|---|---|---|---|
| 4,037,915 | 7/1977 | Cabaud | 339/276 SF X |
| 4,102,039 | 7/1978 | Henrickson et al. | 29/588 X |
| 4,214,120 | 7/1980 | Jones et al. | 174/52 FP |

FOREIGN PATENT DOCUMENTS

| | | | |
|---|---|---|---|
| 2620757 | 11/1977 | Fed. Rep. of Germany | 29/882 |
| 2352415 | 12/1977 | France | 339/258 R |

Primary Examiner—Howard N. Goldberg
Assistant Examiner—Carl J. Arbes

[57] ABSTRACT

The present invention relates to an assembly of contacts to be soldered, constituted by a web in which the contacts are formed and connected together at their end by strips wherein the contacts are alternately disposed in a plane but parallel in laterally spaced relationship and disposed head to tail.

1 Claim, 2 Drawing Figures

METHOD OF APPLYING CONTACTS TO CIRCUIT SUPPORT

This application is a division of application Ser. No. 405,078 filed Aug. 4, 1982 now abandoned.

FIELD OF THE INVENTION

The present invention relates to contacts to be soldered adapted to make connections in electronics and in particular to be mounted on hybrid circuits or on printed circuits. These contacts to be soldered present at one of their ends a clip element in which the edge of a hybrid circuit is for example inserted; the other end of the contact is inserted in a printed circuit or soldered to a conductor.

BACKGROUND OF THE INVENTION

Assemblies of contacts to be soldered are known in particular which are in the form of a web in which the contacts are formed and are connected together at their ends by strips.

When positioning the contacts, the desired number of contacts is cut out from the web, this cut-out operation being effected either by hand or, preferably, mechanically.

OBJECT OF THE INVENTION

It is an object of the invention to provide an improvement in assemblies of contacts to be soldered, which enables the cost price of these contacts, and the time necessary for inserting a series of contacts, to be considerably reduced.

SUMMARY OF THE INVENTION

The assembly of contacts according to the invention is characterized in that the contacts are formed in the web alternately and head to tail.

Due to this arrangement, the contacts may be much closer to one another in the web and, in the same operation, virtually twice as many contacts are formed; there is much less waste. A hybrid circuit or printed circuit card may be inserted simultaneously on each of the edges of the web; the rate of insertion is thus doubled.

BRIEF DESCRIPTION OF THE DRAWINGS

The invention will be more readily understood on reading the following description with reference to the accompanying drawings, in which.

PARTICULAR DESCRIPTION OF THE DRAWINGS

Figure 1:
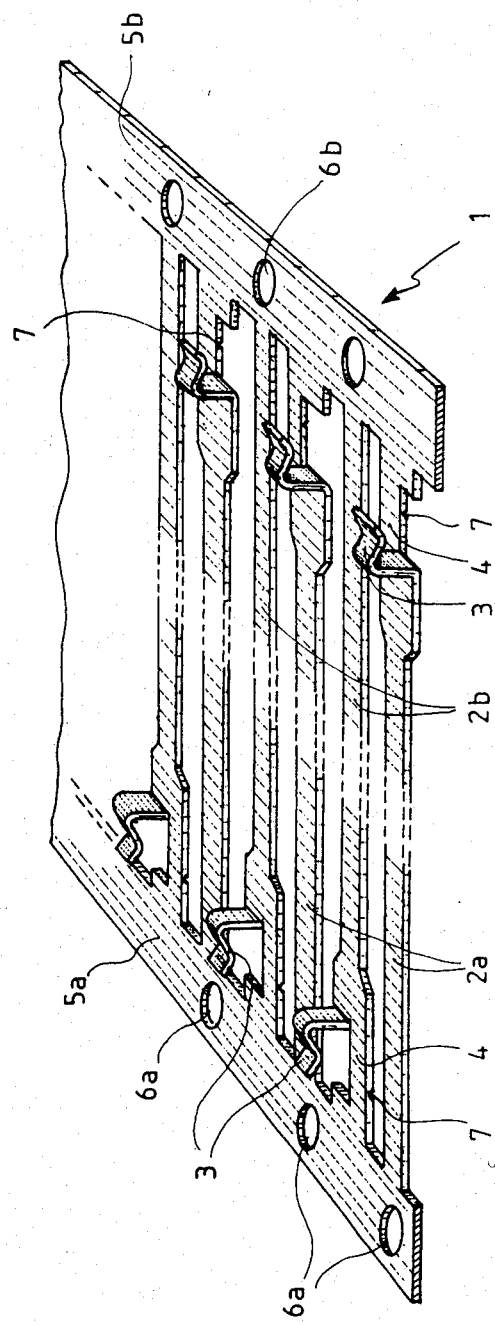
FIG. 1 is a view in perspective of part of the assembly of contacts to be soldered, according to the invention.

Referring now to the drawings, the Figures show a web 1 in which are formed contacts 2a and 2b to be soldered. Each of these contacts comprises an elongated body terminated at one of its ends by a clip element formed by a folded leaf 3 and a flat leaf 4 adjacent the former. The contacts 2a and 2b are alternate and disposed head to tail in the web 1, i.e. the clip element 3–4 of a contact 2a is located between the ends of two contacts 2b not provided with clip elements and, inversely, the clip element 3–4 of a contact 2b is located between the ends of two contacts 2a not provided with clip elements.

Contacts 2a and 2b are connected to one another by strips 5a and 5b. Strip 5a is provided with holes 6a in the axis of contacts 2a; similarly, strip 5b is provided with holes 6b in the axis of contacts 2b. The particular purpose of these holes 6a and 6b is to allow the web 1 to advance, on the one hand when the contacts are manufactured and, on the other hand, when these contacts are positioned on a card forming support for a hybrid circuit or on a printed circuit card.

An incipient crack 7 is provided between the end of the leaf 4 of one clip element and the strip 5a or 5b adjacent thereto.

Figure 2:
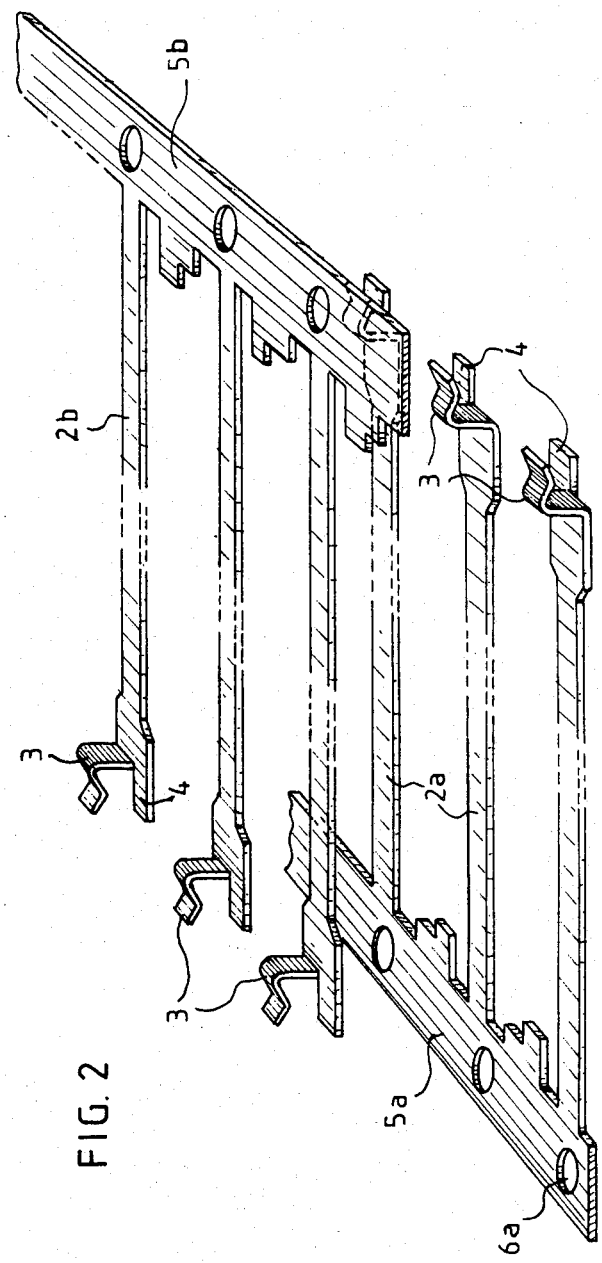
FIG. 2 is a view similar to FIG. 1, showing the two series of contacts separate.

To use this assembly, the clip elements 3–4 of contacts 2a, which remain fast with strip 5a, are separated from the strip 5b, on the one hand and, on the other hand, clip elements 3–4 of contacts 2b, which remain fast with strip 5b, are separated from strip 5a, these separations being effected in the region of the incipient cracks 7 with the aid of a cutting blade (FIG. 2). The contacts 2a and 2b are taken into different planes, i.e. the "combs" resulting from cutting the web apart are relatively shifted perpendicular to the plane of the common web (FIG. 2). and hybrid circuit supports or printed circuit cards are simultaneously inserted in their clip elements 3–4. All that remains is to remove from the inserted contacts the strip 5a or 5b which connects them.

It goes without saying that the present invention must not be considered as being limited to the embodiment described and shown, but covers, on the contrary, all variants thereto.

What I claim is:

1. A method of applying contacts to a circuit support which comprises the steps of:

forming a contact assembly to be soldered comprising a web composed of a succession of mutually parallel transversely spaced elongated contacts each formed with a head constituted by a clip and a tail remote from the respective head, said contacts alternating in direction along said web in head-to-tail relationship and being coplanar with a clip of one contact lying adjacent a tail of the next contact in said direction, the projecting portions of the respective clips projecting out of the web plane in the same direction, and respective connecting strips integral with each of said contacts along opposite edges of said web whereby said contacts can be separated from said connecting strips, said connecting strips extending in a direction transverse to the longitudinal directions of said contacts;

separating each of said heads from the connecting strip with which it was integral to form a pair of interdigitating but separate contact combs having free clips at the ends of the respective contacts connected to the other contact strip whereby the free clips of the two combs are oriented in opposite directions and remote from each other;

thereafter relatively displacing said combs in a direction perpendicular to said plane; and thereafter inserting respective supports into the clips of each of said combs.

* * * * *

UNITED STATES PATENT AND TRADEMARK OFFICE
CERTIFICATE OF CORRECTION

PATENT NO. : 4,616,416

DATED : 14 October 1986

INVENTOR(S) : Aimé CABAUD

It is certified that error appears in the above-identified patent and that said Letters Patent is hereby corrected as shown below:

Item [73] Assignee's name and address to be inserted to read:

--Société Anonyme COMATEL, Rungis, France --.

Signed and Sealed this

Seventeenth Day of February, 1987

Attest:

DONALD J. QUIGG

Attesting Officer  Commissioner of Patents and Trademarks